United States Patent
Schuegraf

(12) 
(10) Patent No.: US 6,444,535 B1
(45) Date of Patent: Sep. 3, 2002

(54) METHOD TO REDUCE EMITTER TO BASE CAPACITANCE AND RELATED STRUCTURE

(75) Inventor: Klaus F. Schuegraf, Aliso Viejo, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/852,183

(22) Filed: May 9, 2001

(51) Int. Cl.[7] ............................................. H01L 21/331
(52) U.S. Cl. ........................................ 438/312; 438/343
(58) Field of Search ................................ 438/312, 313, 438/343, 323, 329, 331, 332, 337, 338, 346, 361, 366, 370, 309; 257/197, 200, 571, 575

(56) References Cited

U.S. PATENT DOCUMENTS 6,121,102 A * 9/2000 Norstrom et al. ........... 438/361
6,177,717 B1 * 1/2001 Chantre et al. ............. 257/565
6,384,469 B1 * 5/2002 Chantre ...................... 257/197

* cited by examiner

Primary Examiner—Trung Dang
Assistant Examiner—Brook Kebede
(74) Attorney, Agent, or Firm—Farjami & Farjami LLP

(57) ABSTRACT

According to a disclosed embodiment, a base region is grown on a transistor region. A dielectric layer is next deposited over the base region. The dielectric layer can comprise, for example, silicon dioxide, silicon nitride, or a suitable low-k dielectric. Subsequently, an opening is fabricated in the dielectric layer, and an emitter layer is formed on top of the dielectric layer and in the opening. Thereafter, an anisotropic polymerizing etch chemistry is utilized to etch the emitter layer down to a first depth, forming an emitter region in the opening. Next, a non-polymerizing etch chemistry having isotropic components is used to create a notch in the dielectric layer below the emitter region. The formation of the notch reduces the overlap area of a capacitor that forms between the emitter region and the base region, which translates to a lower level of emitter to base capacitance.

22 Claims, 6 Drawing Sheets

METHOD TO REDUCE EMITTER TO BASE CAPACITANCE AND RELATED STRUCTURE

BACKGROUND OF THE INVENTION

1. Field of the Invention

The present invention is generally in the field of fabrication of semiconductor devices. More particularly, the present invention is in the field of fabrication of heterojunction bipolar transistors.

2. Related Art

In a silicon-germanium ("SiGe") heterojunction bipolar transistor ("HBT"), a thin silicon-germanium layer is grown as the base of a bipolar transistor on a silicon wafer. The silicon-germanium HBT has significant advantages in speed, frequency response, and gain when compared to a conventional silicon bipolar transistor. Cutoff frequencies in excess of 100 GHz, which are comparable to the more expensive gallium-arsenide based devices, have been achieved for the silicon-germanium HBT.

The higher gain, speed and frequency response of the silicon-germanium HBT are possible due to certain advantages of silicon-germanium, such as a narrower band gap and reduced resistivity. These advantages make silicon-germanium devices more competitive than silicon-only devices in areas of technology where superior speed and frequency response are required.

But as with other transistors, excess capacitance can detrimentally impact performance of the silicon-germanium HBT transistor, primarily by reducing its speed. One form of excess capacitance associated with the silicon-germanium HBT is emitter to base capacitance. The practical effect of a capacitor is that it stores electrical charges that are later discharged, and the extra time required to charge and discharge the excess capacitance slows down the transistor. Because the benefits of high gain and high speed can be compromised by such excess capacitance, it is a goal of silicon-germanium HBT design to reduce such excess capacitance to a minimum. For instance, by keeping the emitter to base capacitance low, improved transistor performance is achieved.

Capacitance develops, for example, when two plates made of an electrically conducting material are separated by a dielectric such as silicon dioxide ("$SiO_2$"). In general, capacitance is determined by the geometry of the device and is directly proportional to the area of overlap between the conductive plates and inversely proportional to the distance, or thickness, separating the two plates. Generally, capacitance is calculated using the equation:

$$\text{Capacitance } (C) = \epsilon_0 k A / t \quad \text{(Equation 1)}$$

where $\epsilon_0$ is the permitivity of free space, k is the dielectric constant of the dielectric separating the two plates, A is the area of overlap between the plates, and t is the thickness or separation between the two plates. From the equation, it is seen that reducing the area of overlap between the two plates could lower the capacitance. Alternatively, separating the plates with a dielectric material having a relatively lower dielectric constant k, or increasing the thickness t, of the dielectric material could also lower the capacitance.

FIG. 1 shows an NPN silicon-germanium HBT structure 100, which is used to describe the emitter to base capacitance, or emitter-base capacitance, found in a silicon-germanium HBT fabricated using conventional fabrication processes. Certain details and features have been left out of FIG. 1 which are apparent to a person of ordinary skill in the art. Structure 100 includes, among other components, collector 130, base region 120, and emitter 140. In exemplary structure 100, collector 130 is N type single-crystal silicon which can be deposited epitaxially using a reduced pressure chemical vapor deposition ("RPCVD") process, and base region 120 is P type single-crystal silicon-germanium deposited epitaxially in a nonselective RPCVD process. As seen in FIG. 1, base region 120 is situated on top of, and forms a junction with, collector 130. Extending out from either side of base region 120 are extrinsic base region 122 and extrinsic base region 124. In exemplary structure 100, emitter 140, which is situated above and forms a junction with base region 120, is comprised of N type polycrystalline silicon. The interface between emitter 140, base region 120, and collector 130 is the active region of the silicon-germanium HBT. Active region width 145 is substantially the same as the distance between dielectric segment 172 and dielectric segment 174. As is known in the art, proper control of the dimension of active region width 145 is critical for optimal performance of the silicon-germanium HBT.

The portions of emitter 140 extending beyond active region width 145 overlap polycrystalline silicon segment 162 and polycrystalline silicon segment 164. The portions of emitter 140 extending beyond active region width 145 are referred to as extrinsic emitter region 142 and extrinsic emitter region 144. Thus, extrinsic emitter region 142 is the region of emitter 140 which is between dashed line 192 and the edge of emitter 140. Similarly, extrinsic emitter region 144 is the region of emitter 140 which is between dashed line 194 and the edge of emitter 140. As seen in FIG. 1, sandwiched between polycrystalline silicon segment 162 and extrinsic base region 122, and between polycrystalline silicon segment 164 and extrinsic base region 124 are dielectric segment 172 and dielectric segment 174. Besides defining active region width 145, dielectric segments 172 and 174 provide electrical isolation to emitter 140 from base region 120.

As further seen in FIG. 1, buried layer 114, which is composed of N+ type material, is formed in semiconductor substrate 110. Collector sinker 112, also composed of N+ type material, is formed by diffusion of heavily concentrated dopants from the surface of collector sinker 112 down to buried layer 114. Buried layer 114 and collector sinker 112 provide a low resistance electrical pathway from collector 130 through buried layer 114 and collector sinker 112 to a collector contact (not shown). Deep trench structures 116 and field oxide region 180, field oxide region 182, and field oxide region 184 provide electrical isolation from other devices on semiconductor substrate 110. Although field oxide regions 180, 182, and 184 comprise silicon dioxide in the present example, it is known in the art that field oxide regions 180, 182, and 184 could be other types of isolation, for example shallow trench isolation regions, deep trench isolation, or local oxidation of silicon, generally referred to as "LOCOS".

Emitter to base capacitance ("$C_{eb}$") in a silicon-germanium HBT is composed of intrinsic and extrinsic components. These intrinsic and extrinsic components of the emitter to base capacitance are shown in FIG. 1. Intrinsic $C_{eb}$ 150 is between emitter 140 and single-crystal silicon-germanium base region 120 of the silicon-germanium HBT. Intrinsic $C_{eb}$ 150 is the emitter-base junction capacitance inherent in the silicon-germanium HBT device and is determined by various fabrication parameters in the silicon-germanium HBT device. Therefore, intrinsic $C_{eb}$ 150 can only be reduced by altering the fabrication parameters and the performance of the device itself. For example, reduction in intrinsic $C_{eb}$ 150 could be achieved by making active region width 145 narrower, but such a modification to the device architecture would alter the performance properties of the device.

Continuing with FIG. 1, extrinsic components of emitter to base capacitance in a silicon-germanium HBT develop where extrinsic emitter region 142 and extrinsic emitter region 144 overlap, respectively, extrinsic base region 122 and extrinsic base region 124 directly through dielectric segment 172 and dielectric segment 174. More specifically, extrinsic $C_{eb}$ 152 is between extrinsic emitter region 142 and extrinsic base region 122 through dielectric segment 172, while extrinsic $C_{eb}$ 154 is between extrinsic emitter region 144 and extrinsic base region 124 through dielectric segment 174. The total value of emitter to base capacitance ("total $C_{eb}$") in a silicon-germanium HBT is thus the sum of intrinsic $C_{eb}$ 150, extrinsic $C_{eb}$ 152, and extrinsic $C_{eb}$ 154.

Various methods aimed at reducing the total $C_{eb}$ have been introduced, as known in the art, but these methods have not produced the level of reduction desired or, in other instances, are impractical to implement. For example, one method proposed involves reducing the geometries of the silicon-germanium HBT, particularly reducing the portions of the emitter that extend beyond the width of the active region and overlap extrinsic base regions. Unfortunately, such undesired overlapping can only be reduced to the extent permitted by current photolithography processes utilized to fabricate the emitter. Thus a certain amount of overlapping is unavoidable because of the limitation in resolution with current photolithography technology. Another proposed method is directed to reducing the area of the active region of the silicon-germanium HBT. Utilizing such a method would reduce intrinsic $C_{eb}$, but as discussed briefly above, altering the device geometry would require altering the device fabrication process and can compromise the device's performance and reduce its effectiveness.

There is thus a need in the art for method of HBT fabrication that reduces emitter to base capacitance in the HBT. More particularly, there is a need for a method that will limit $C_{eb}$ without impacting the HBT device geometry and diminishing its performance thereby. Further, there is a need in the art for a method which is practical to implement and which will reduce $C_{eb}$ effectively.

SUMMARY OF THE INVENTION

The present invention is directed to method to reduce emitter to base capacitance ("$C_{eb}$") and related structure. In one embodiment, the invention results in a heterojunction bipolar transistor ("HBT") with an emitter to base capacitance which is lower than that of similar devices fabricated utilizing conventional fabrication methods. Further, the invention achieves the reduction in $C_{eb}$ without adversely impacting the HBT device geometry or impacting its performance. Moreover, the present invention is practical to implement.

According to one embodiment of the invention, a base region is grown on a transistor region. A dielectric layer is next deposited over the base region. The dielectric layer can comprise, for example, silicon dioxide, silicon nitride, or a suitable low-k dielectric. Subsequently, an opening is fabricated in the dielectric layer, and an emitter layer is formed on top of the dielectric layer and in the opening. Thereafter, an anisotropic and polymerizing etch chemistry is utilized to etch the emitter layer down to a first depth, forming an emitter region in the opening. Next, a non-polymerizing etch chemistry having isotropic components is used to create a notch in the dielectric layer below the emitter region. The formation of the notch reduces the overlap area of a capacitor that forms between the emitter region and the base region, i.e. the emitter to base capacitance. The reduction in the size of the overlap area translates to a reduction in the emitter to base capacitance.

Moreover, a HBT structure can be fabricated in which the extrinsic emitter region and the extrinsic base region are separated by a first notched dielectric segment. The extrinsic emitter region has a polymerized surface adjacent to a non-polymerized surface of the first notched dielectric segment. The result is a HBT structure wherein the emitter to base capacitance is relatively low.

DETAILED DESCRIPTION OF THE INVENTION

The present invention is directed to method to reduce emitter to base capacitance and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
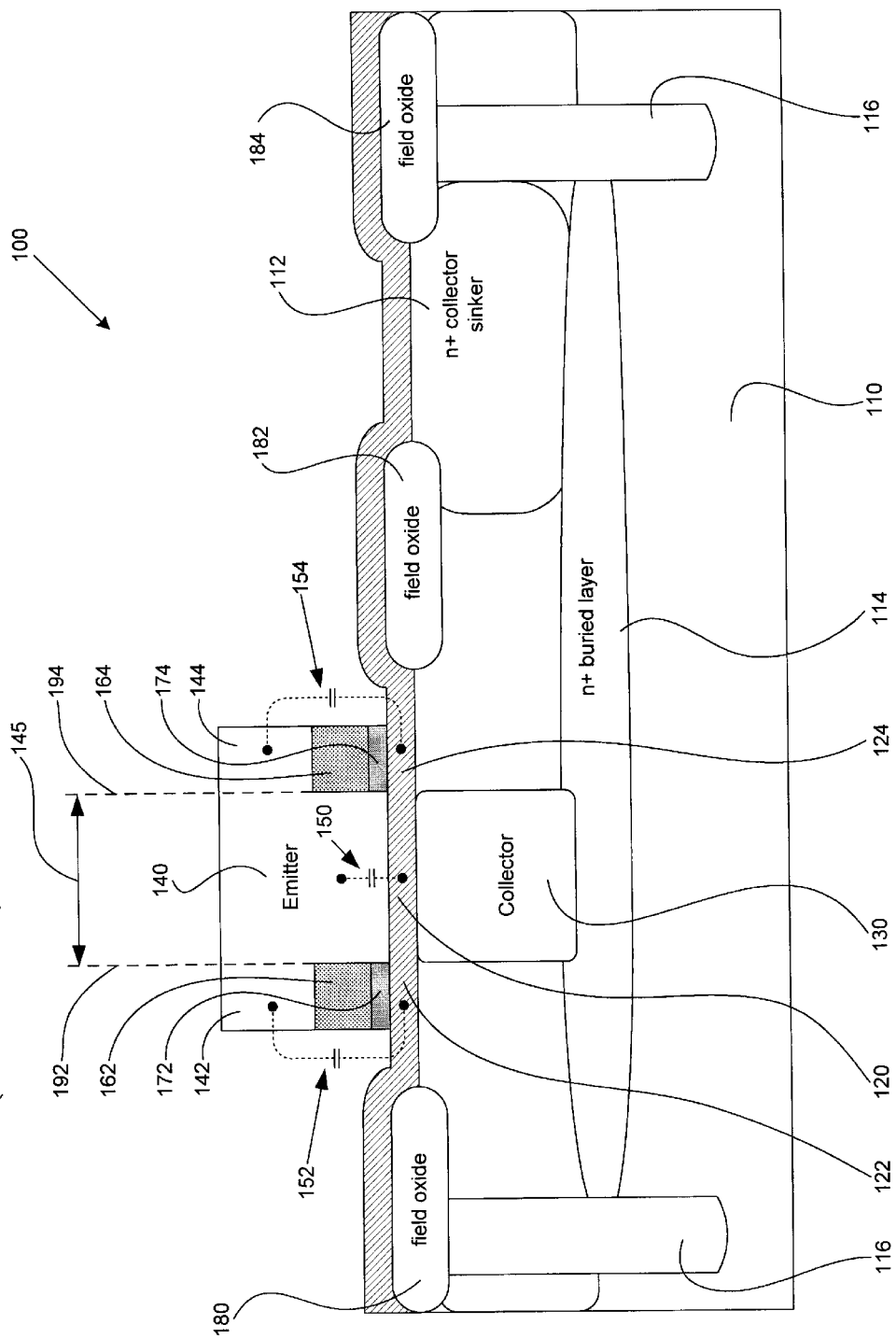
FIG. 1 illustrates a cross sectional view of the features of a HBT fabricated utilizing conventional methods.
Figure 2:
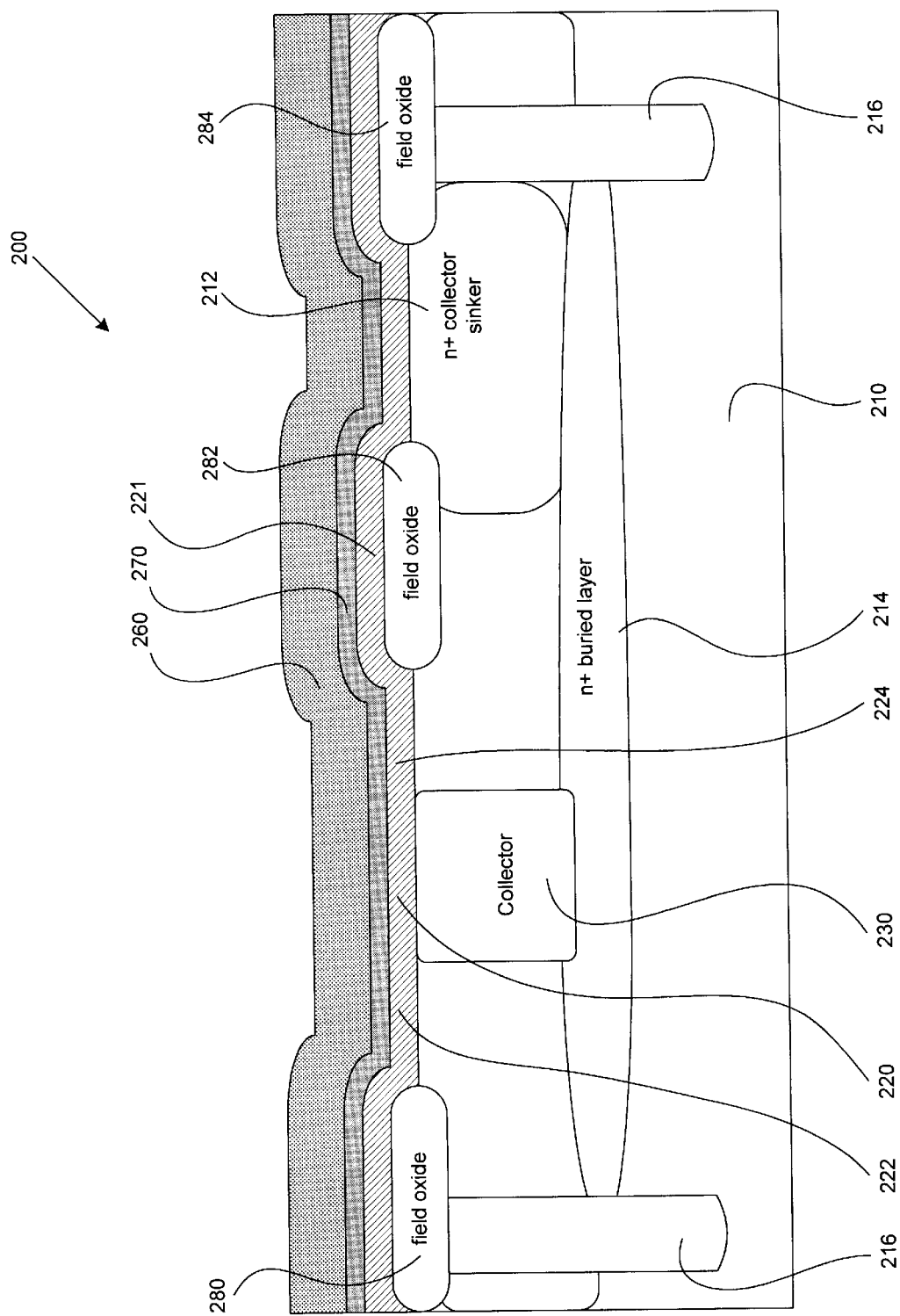
FIG. 2 illustrates a cross sectional view of some of the features of an HBT in an intermediate stage of fabrication, formed in accordance with one embodiment of the present invention.

FIG. 2 shows an NPN silicon-germanium ("SiGe") heterojunction bipolar transistor ("HBT") structure 200, which is used to describe one embodiment of the present invention. Certain details and features have been left out of FIG. 2 which are apparent to a person of ordinary skill in the art. Structure 200 shows certain components of the silicon-germanium HBT in an intermediate stage of fabrication.

Structure 200 includes collector 230, which is N type single-crystal silicon and can be formed using a dopant diffusion process in a manner known in the art. Buried layer 214, which is composed of N+ type material—meaning that it is relatively heavily doped N type material—is formed in semiconductor substrate 210 in a manner known in the art. Collector sinker 212, also composed of N+ type material, is formed by diffusion of heavily concentrated dopants from the surface of collector sinker 212 down to buried layer 214. Buried layer 214, along with collector sinker 212, provide a low resistance electrical pathway from collector 230 through buried layer 214 and collector sinker 212 to a collector contact (not shown).

Continuing with FIG. 2, deep trench structures 216 and field oxide region 280, field oxide region 282, and field oxide region 284 are formed in a manner known in the art and provide electrical isolation from other devices on semiconductor substrate 210. Moreover, the region between field oxide regions 280 and 282 is referred to as a "transistor region" in the present application. Although field oxide regions 280, 282, and 284 comprise silicon dioxide in the present embodiment of the invention, a person skilled in the art will recognize that other materials may be used instead, for example silicon nitride, a low-k dielectric, or other suitable dielectric material. Field oxide regions 280, 282, and 284 can also be other forms of isolation, for example local oxidation of silicon ("LOCOS") or shallow trench isolation oxide ("STI"), formed in a manner known in the art. Thus, although the present embodiment is directed to field oxide regions comprising silicon dioxide, a person skilled in the art will recognize that other suitable types of isolation may be utilized instead.

Continuing with FIG. 2, a blanket layer of silicon-germanium is formed on semiconductor substrate 210 and its various components including collector 230. Silicon-germanium layer 221, which can be, for example, P type silicon-germanium deposited epitaxially in a nonselective reduced pressure chemical vapor deposition process ("RPCVD"), is formed on collector 230 to serve as the base for the silicon-germanium HBT. The portion of silicon-germanium layer 221 formed on collector 230 is single-crystal silicon-germanium, and this portion is referred to as silicon-germanium base region 220, or base region 220, in the present application. Extending out from each side of base region 220 are extrinsic base region 222 and extrinsic base region 224. FIG. 2 shows that structure 200 includes several features and components used to form the silicon-germanium HBT at a stage prior to the addition of an emitter.

As further seen in FIG. 2, a blanket layer of dielectric has been deposited on semiconductor substrate 210 and its various components including silicon-germanium base region 220. Dielectric layer 270 can comprise silicon dioxide, silicon nitride, a low-k dielectric, or other suitable dielectric material. Dielectric layer 270 can be, for example, in the range of approximately 80 Angstroms to approximately 500 Angstroms and is deposited in a manner known in the art. In one embodiment of the present invention, dielectric layer 270 comprises silicon dioxide deposited using a chemical vapor deposition process ("CVD").

FIG. 2 also shows polycrystalline silicon layer 260 deposited on dielectric layer 270. Polycrystalline silicon layer 260 is also referred to as a "conductive layer" in the present application. Although the present embodiment of the invention is directed to depositing a layer of polycrystalline silicon on dielectric layer 270, other suitable materials may be used instead. For example, polycrystalline silicon layer 260 could be amorphous silicon, amorphous silicon-germanium, amorphous silicon carbide, or polycrystalline silicon carbide. Further, polycrystalline silicon layer 260 can be, for example, between approximately 500 Angstroms and approximately 2000 Angstroms.

Dielectric layer 270 and polycrystalline silicon layer 260 are important for controlling the emitter width in subsequent fabrication steps. Proper control of the emitter width, and thereby the width of the silicon-germanium HBT active area, is essential for optimal performance of the device.

Figure 3:
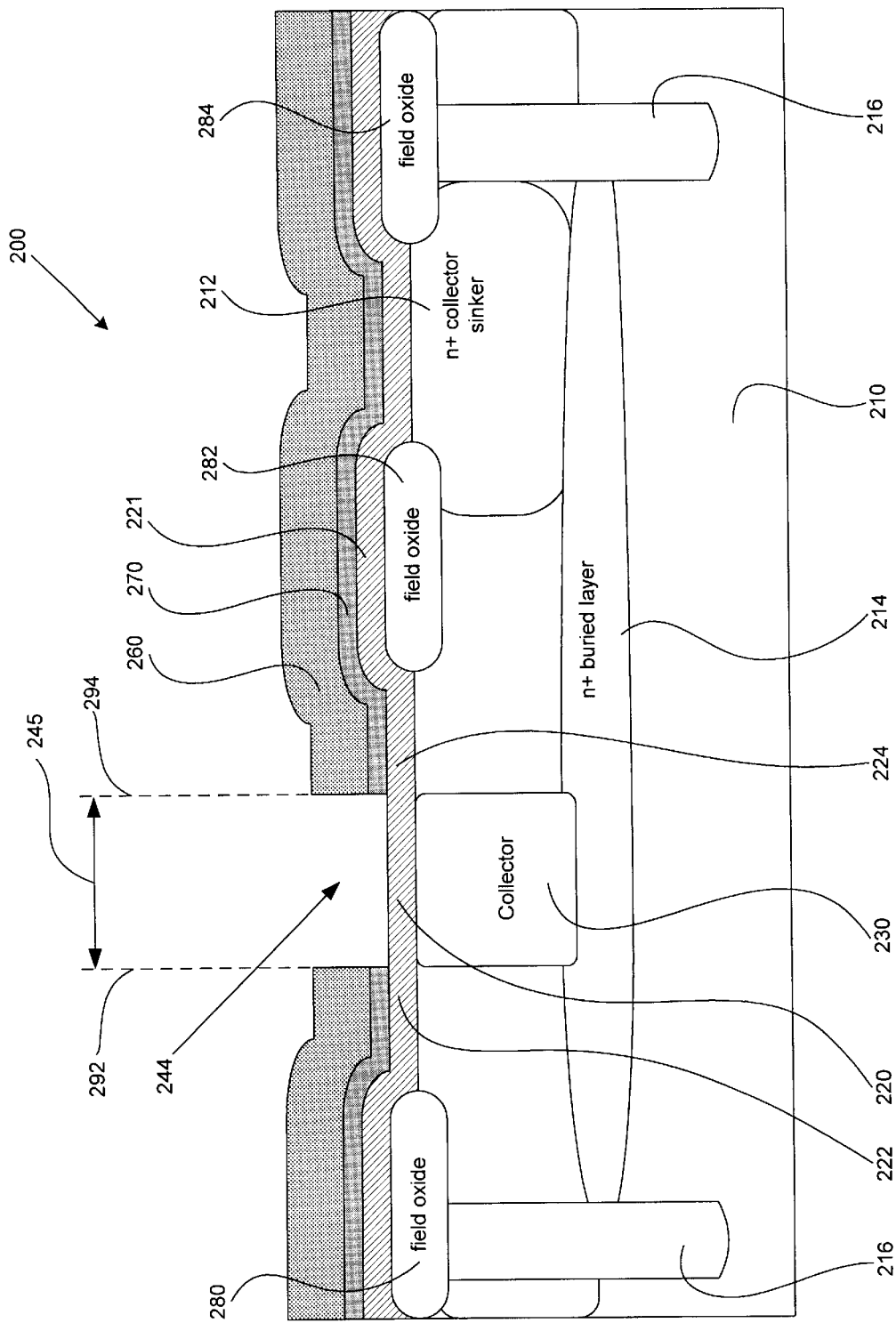
FIG. 3 illustrates a cross sectional view of some of the features of an HBT in an intermediate stage of fabrication, formed in accordance with one embodiment of the present invention.

Referring to FIG. 3, it is seen that dielectric layer 270 and polycrystalline silicon layer 260 have been etched down to silicon-germanium base region 220 to form opening 244 with active region width 245. Active region width 245 will define the emitter width of the emitter fabricated in later steps. Active region width 245 is the distance confined by dashed line 292 and dashed line 294 in FIG. 3.

Formation of opening 244 is done in a manner known in the art. For example, fluorine compounds such as carbon tetrafluoride ($CF_4$) and/or chlorine compounds may be utilized to etch polycrystalline silicon layer 260, followed by an HF ("hydrogen fluoride") wash utilized to etch dielectric layer 270. Other etchants may be used as known in the art. By choosing appropriate etchants, lateral etching, or "undercutting", of polycrystalline silicon layer 260 and dielectric layer 270 is kept to a minimum. Undercutting can detrimentally affect performance of the silicon-germanium HBT because it creates uncertainty in the dimensions of active region width 245 of opening 244 and thereby creates uncertainty in the dimensions of the emitter and active area formed in later steps.

Figure 4:
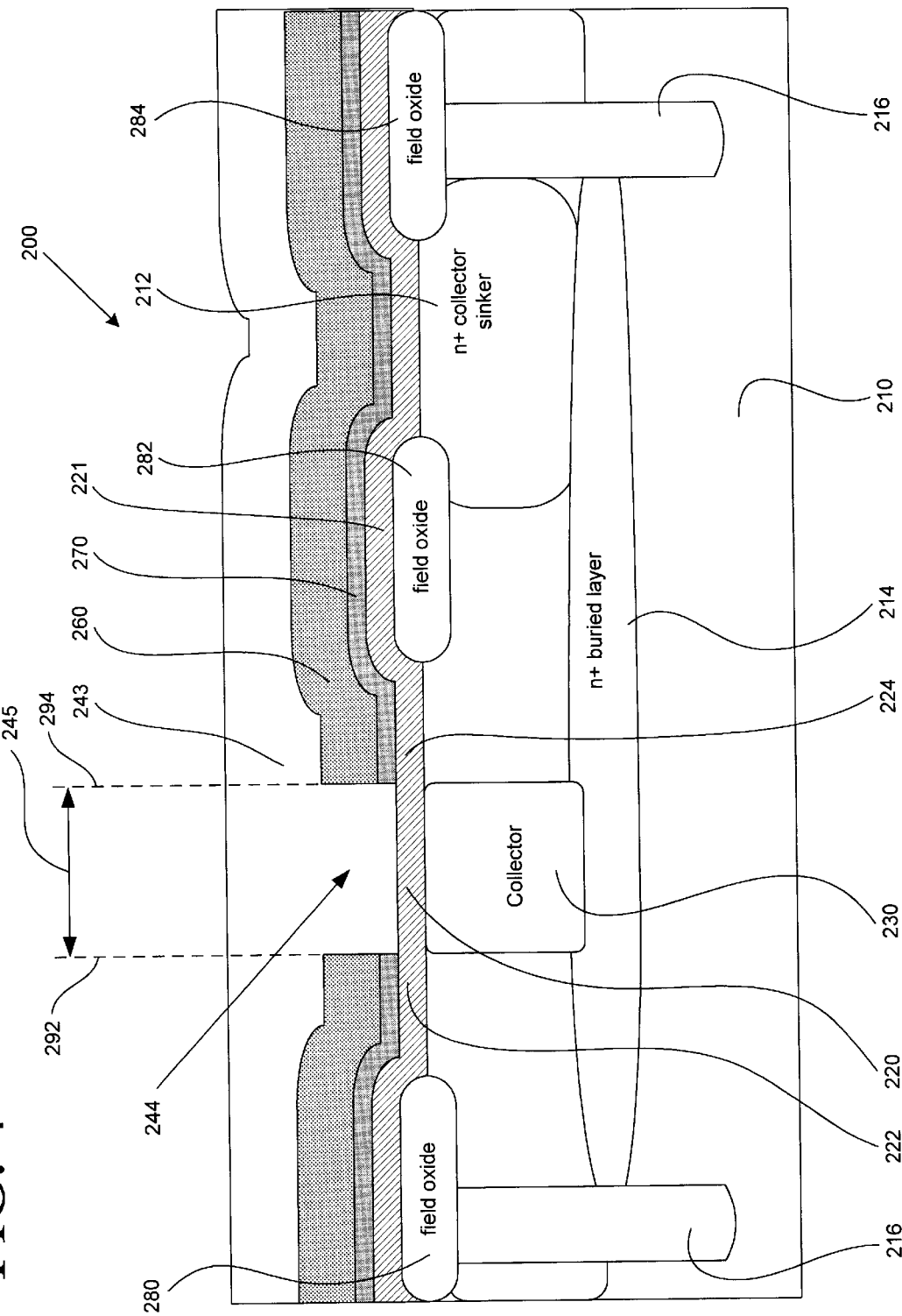
FIG. 4 illustrates a cross sectional view of some of the features of an HBT in an intermediate stage of fabrication, formed in accordance with one embodiment of the present invention.

FIG. 4 shows the result following a subsequent step wherein emitter layer 243 is fabricated on polycrystalline silicon layer 260 and in opening 244 with width 245. It is noted that emitter layer 243 assumes the dimensions defined by opening 244 with width 245. In the present embodiment of the invention, emitter layer 243 comprises N type polycrystalline silicon deposited in a manner known in the art and can be between approximately 1000 Angstroms and approximately 3000 Angstroms thick over polycrystalline silicon layer 260.

Figure 5:
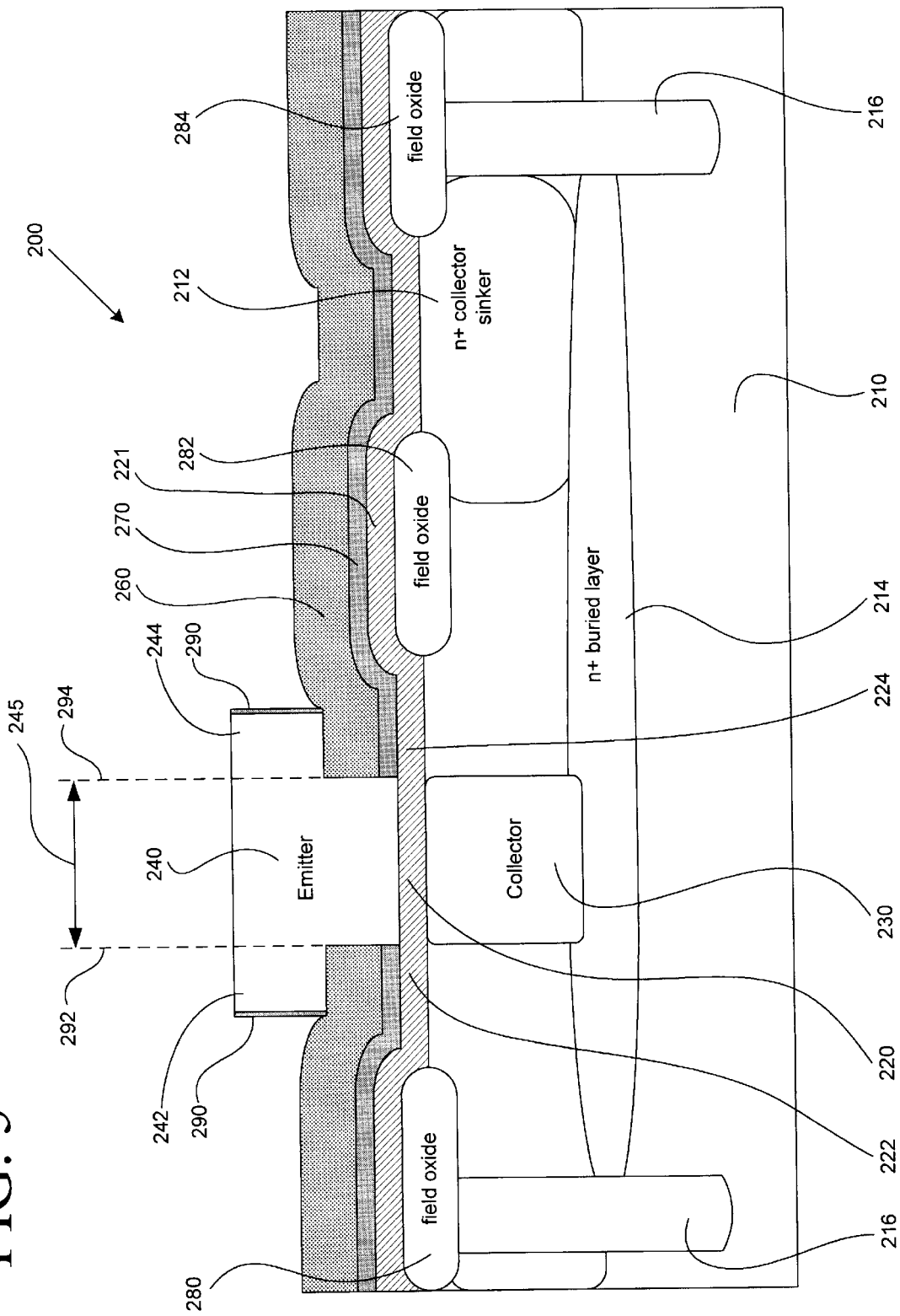
FIG. 5 illustrates a cross sectional view of some of the features of an HBT in an intermediate stage of fabrication, formed in accordance with one embodiment of the present invention.

FIG. 5 shows the result of an etching process that etches emitter layer 243 to form emitter 240. The portions of emitter 240 extending beyond active region width 245 are referred to as extrinsic emitter region 242 and extrinsic emitter region 244. Thus, extrinsic emitter region 242 is the region of emitter 240 which is between dashed line 292 and the edge of emitter 240. Similarly, extrinsic emitter region 244 is the region of emitter 240 which is between dashed line 294 and the edge of emitter 240.

Etching of emitter layer 243 is done utilizing an anisotropic etch chemistry selected for its polymerization properties. The polymer byproducts of the anisotropic polymerizing etch chemistry forms passivation coat 290 on the sides of emitter 240. Passivation coat 290 is also referred to as a "polymerized surface" in the present application. It is noted that polymerization does not occur on the top surface of emitter 240 because the photoresist patterned on the top surface of emitter 240 prior to the etching process shields the top surface of emitter 240 from etchants. It is noted that the photoresist patterning step and the patterned photoresist are not shown in any of the Figures in this application since they are well known in the art. The polymerizing etch chemistry produces polymer byproducts which form passivation coat 290 which provides protection to emitter 240 from etchants and chemicals that are used in subsequent steps.

Figure 6:
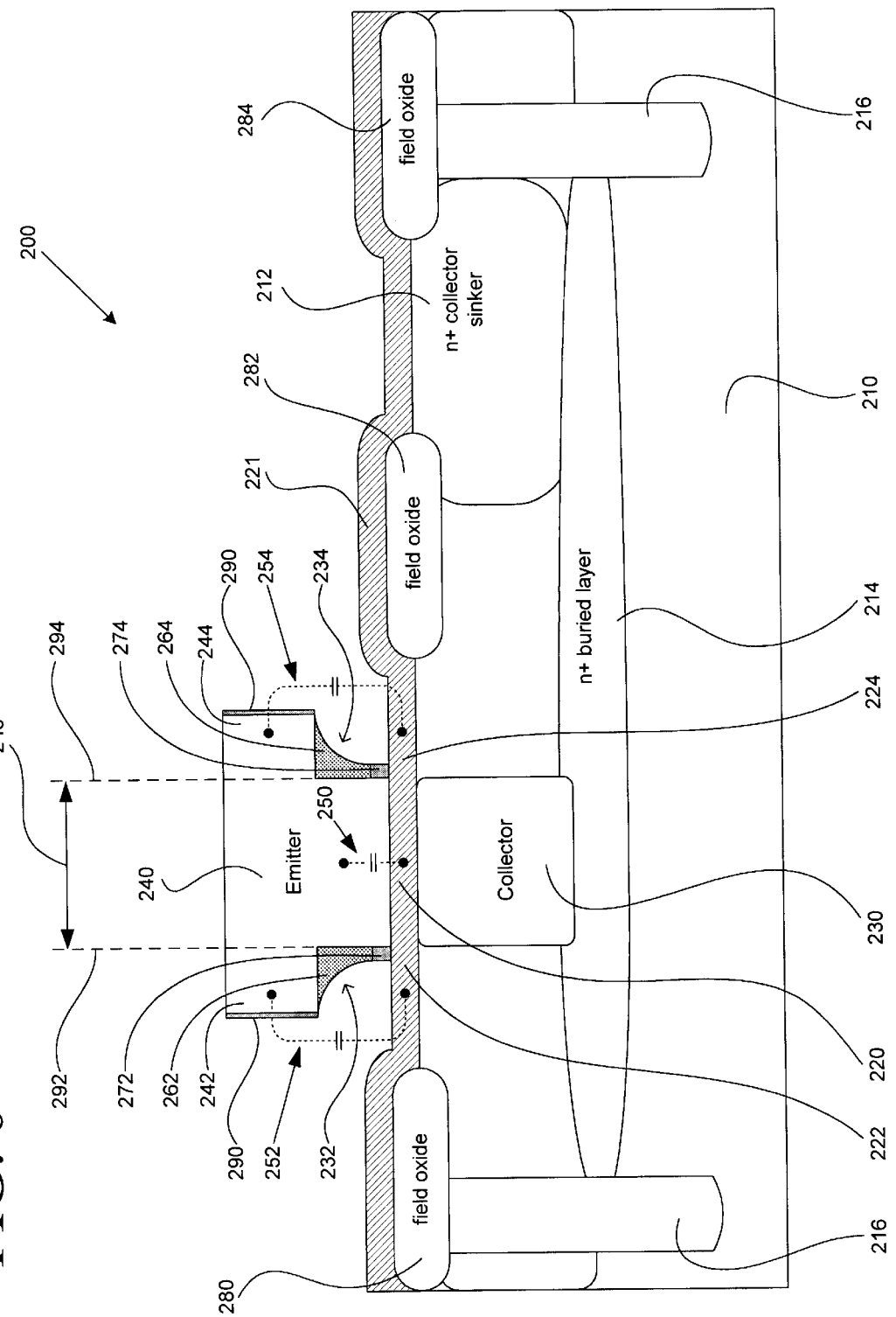
FIG. 6 illustrates a cross sectional view of some of the features of an HBT fabricated in accordance with one embodiment of the present invention.

In contrast to using an anisotropic polymerizing etch chemistry to form emitter 240 while forming passivation coat 290 on each side of emitter 240 as discussed above, in the next step the present invention utilizes an isotropic non-polymerizing etch chemistry in order to achieve the goals of the present invention in a manner described in relation to FIG. 6. FIG. 6 shows the results of a final etching step utilizing non-polymerizing chemicals to isotropically etch polycrystalline silicon layer 260 and dielectric layer 270, down to silicon-germanium layer 221. The non-polymerizing etch chemistry utilized in this present etching step does not produce a polymer byproduct, and thus no passivation coat develops as a result. As stated above, in addition to not having polymerizing properties, the etch chemistry utilized in this present etching step has isotropic components which undercut polycrystalline silicon layer 260 and dielectric layer 270, forming notch 232 and notch 234. Notches 232 and 234 have a size determined by the extent of undercutting that occurs. It is noted that the formation of notch 232 and notch 234 does not alter the dimensions of the silicon-germanium HBT's active region, i.e. the active region width 245. It is further noted that, as stated above, passivation coat 290 serves as a barrier around emitter 240 and protects emitter 240 from attack by the etch chemistry as well as from undercutting by the isotropic components utilized in the present step.

Continuing with FIG. 6, it is seen in the present embodiment of the invention that an NPN silicon-germanium HBT has been fabricated comprising N type polycrystalline emitter 240, P type single-crystal silicon-germanium base region 220, and N type single-crystal silicon collector 230. Moreover, the silicon-germanium HBT has an active region, i.e. the junction between emitter 240, base region 220, and collector 230, defined by active region width 245.

As described above, the formation of notch 232 and notch 234 is the result of the etching of dielectric layer 270 and polycrystalline silicon layer 260 by a non-polymerizing etch chemistry having isotropic etching components which create a notch in dielectric layer 270 and polycrystalline silicon layer 260. FIG. 6 shows that what remains of dielectric layer 270 and polycrystalline silicon layer 260 following the etching step are "leftover" portions of these two layers. More specifically, FIG. 6 shows that the etching and undercutting of dielectric layer 270 and polycrystalline silicon layer 260 to form notch 232 and notch 234 leave behind leftover dielectric portion 272, leftover dielectric portion 274, leftover polycrystalline silicon portion 262, and leftover polycrystalline silicon portion 264. Leftover polycrystalline silicon portions 262 and 264 are electrically connected to emitter 240 while leftover dielectric portions 272 and 274 provide electrical isolation to emitter 240 from base region 220. Leftover polycrystalline silicon portions 262 and 264 are also referred to as "conductive segments", and dielectric portions 272 and 274 are also referred to as "dielectric segments" in the present application.

FIG. 6 further shows the intrinsic and extrinsic components of emitter to base capacitance in the silicon-germanium HBT. Intrinsic $C_{eb}$ 250 is between emitter 240 and base region 220 of the silicon-germanium HBT. Intrinsic $C_{eb}$ 250 is the emitter-base junction capacitance inherent in the silicon-germanium HBT device and is determined by various fabrication parameters in the silicon-germanium HBT device. Extrinsic $C_{eb}$ 252 develops where extrinsic emitter region 242 overlaps extrinsic base region 222, and extrinsic $C_{eb}$ 254 develops where extrinsic emitter region 244 overlaps extrinsic base region 224.

The formation of notch 232 and notch 234 reduces the effective areas of overlap between extrinsic emitter region 242 and extrinsic base region 222 and between extrinsic emitter region 244 and extrinsic base region 224. The effective areas of overlap are those areas where extrinsic emitter region 242 overlaps extrinsic base 222 directly through leftover dielectric portion 272, and where extrinsic emitter region 244 overlaps extrinsic base region 224 directly through leftover dielectric portion 274. Thus, the formation of notch 232 and notch 234, which results in comparatively small leftover dielectric portions 272 and 274, results in a reduction in the effective areas of overlap. The reduction in effective areas of overlap, or "overlap areas of a capacitor", achieved by the present invention translates accordingly to a reduction in the total $C_{eb}$, based on Equation (1):

Capacitance $(C)=\epsilon_0 kA/t$         (Equation 1).

As stated above, $\epsilon_0$ is the permitivity of free space, k is the dielectric constant of the dielectric separating the two capacitor plates, A is the areas of effective overlap between the plates, i.e. where extrinsic emitter segments 242 and 244 overlap extrinsic base regions 222 and 224 directly through leftover dielectric portions 272 and 274, and t is the thickness or separation between the two plates. The amount of overlap is also referred to as the "size of the overlap area" in the present application.

In the present embodiment of the invention, the formation of notch 232 and notch 234 reduces the effective areas of overlap between extrinsic emitter region 242 and extrinsic base region 222, and between extrinsic emitter region 244 and extrinsic base region 224. In other words, the area A, in Equation (1) is decreased because the formation of notch 232 and notch 234 results in relatively smaller leftover dielectric portions 272 and 274. Thus, by forming notches 232 and 234, the present invention achieves a reduction in extrinsic $C_{eb}$ 252 and extrinsic $C_{eb}$ 254, and a corresponding reduction in the total $C_{eb}$ in the HBT.

Equation 1 also shows that the value of capacitance is inversely proportional to the separation, t, between the capacitor plates, i.e. capacitance can be reduced by increasing the separation distance between the capacitor plates. The present invention achieves a reduction in the total $C_{eb}$ by increasing the effective separation between extrinsic emitter region 242 and extrinsic base region 222, and between extrinsic emitter region 244 and extrinsic base region 224.

As shown in FIG. 6, the formation of notch 232 and notch 234 results in relatively small leftover polycrystalline silicon portions 262 and 264. FIG. 6 also shows that, because of notches 232 and 234, leftover polycrystalline silicon portions 262 and 264 are not of a uniform thickness but are tapered and thinned at certain sections by notches 232 and 234. Consequently, the effective separation between extrinsic emitter region 242 and extrinsic base 222, and between extrinsic emitter region 244 and extrinsic base region 224 is increased, most notably at those sections of leftover polycrystalline silicon portions 262 and 264 where more polycrystalline material has been etched out. The increase in effective separation results in a reduction in extrinsic $C_{eb}$ 252 and extrinsic $C_{eb}$ 254.

It can be further inferred from Equation (1) that $C_{eb}$ is directly proportional to the dielectric constant, k, of the dielectric material separating the capacitor plates. In the present embodiment of the invention, extrinsic emitter region 242 and extrinsic base region 222 are separated, in part, by leftover dielectric portion 272, while extrinsic emitter region 244 and extrinsic base region 224 are separated, in part, by leftover dielectric portion 274. Leftover dielectric portions 272 and 274 comprise, for example, silicon dioxide which has a dielectric constant of approximately 4.0. Alternatively, if leftover dielectric portion 272 and leftover dielectric portion 274 were comprised of a different material, for example a suitable low-k dielectric, the total $C_{eb}$ would be lower. For instance, some low-k dielectric material have a dielectric constant of approximately 2.0 which, when used as leftover dielectric portions 272 and 274, would lower the extrinsic component of the total $C_{eb}$. Examples of low-k dielectric materials that may be used in the present invention to fabricate leftover dielectric portions 272 and 274 are: porous silica (with a dielectric constant of 1.2 to 2.3), fluorinated amorphous carbon (with a dielectric constant of 2.0 to 2.6), fluoro-polymer (with a dielectric constant of 1.9 to 2.0), parylene (with a dielectric constant of 2.2 to 2.9), polyarylene ether (with a dielectric constant of 2.6 to 2.8), silsesquioxane (with a dielectric constant of 2.5 to 3.0), fluorinated silicon dioxide (with a dielectric constant of 3.2 to 3.6), and diamond-like carbon (with a dielectric constant of 2.4 to 2.8). All of these dielectrics have a dielectric constant below the widely used dielectric silicon dioxide. Manifestly, if the dielectric material used has a higher k than silicon dioxide, the capacitance value would be proportionately raised. Hence, by fabricating leftover dielectric portions 272 and 274 from a low-k dielectric it is possible to reduce the extrinsic component of the total $C_{eb}$.

It is appreciated by the above description that the present invention provides a method for fabrication of a silicon-germanium heterojunction bipolar transistor in which the emitter to base capacitance is lower than that found in similar devices fabricated utilizing conventional silicon-germanium HBT fabrication processes. Furthermore, the present invention reduces the $C_{eb}$ without modifying the geometries of the active regions of the silicon-germanium HBT. As such, the performance of the silicon-germanium HBT is not adversely affected. Although the invention is described as applied to the construction of a silicon-germanium HBT, it will be apparent to a person of ordinary skill in the art how the invention can be applied in similar situations where emitter to base capacitance needs to be reduced to improve transistor performance.

From the above description of the invention it is manifest that various techniques can be used for implementing the concepts of the present invention without departing from its scope. For example, as stated above, dielectric layer 270 comprises silicon dioxide but can instead comprise silicon nitride, a low-k dielectric, or other suitable dielectric material. Moreover, although dielectric layer 270 has been described as being between approximately 80 Angstroms to approximately 500 Angstroms, it is noted that other embodiments of the invention can be practiced where such dielectric layer is of a different thickness, depending on, for example, what dielectric material is used. Additionally, although the description has been directed to an N type emitter, a P type base, and an N type collector, thus forming an NPN device, the invention is equally applicable to, for example, a PNP device. The described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for reducing emitter to base capacitance and related structure have been described.

What is claimed is:

1. A method comprising steps of:
   growing a base region in a transistor region;
   depositing a dielectric layer over said transistor region and on top of said base region;
   fabricating an opening in said dielectric layer over said base region;
   forming an emitter layer on top of said dielectric layer;
   utilizing an anisotropic etch chemistry to etch said emitter layer down to a first depth, whereby an emitter region is created in said opening;
   using an isotropic etch chemistry to create a notch in said dielectric layer below said emitter region so as to reduce an overlap area of a capacitance formed between said emitter region and said base region.

2. The method of claim 1 wherein said base region comprises silicon-germanium.

3. The method of claim 1 wherein said emitter layer comprises polycrystalline silicon.

4. The method of claim 1 wherein said dielectric layer is selected from a group consisting of silicon dioxide, silicon nitride, and a low-k dielectric.

5. The method of claim 1 wherein said anisotropic etch chemistry forms a passivation layer on a surface of said emitter region.

6. The method of claim 1 further comprising a step of manufacturing a conductive layer on top of said dielectric layer prior to said step of fabricating an opening in said dielectric layer.

7. The method of claim 6 wherein said notch is created in said dielectric layer and said conductive layer.

8. The method of claim 6 wherein said conductive layer comprises polycrystalline silicon.

9. The method of claim 1 wherein said capacitance is inversely proportional to a size of said notch.

10. The method of claim 1 wherein said capacitance is directly proportional to a size of said overlap area.

11. The method of claim 1 wherein said capacitance is inversely proportional to a thickness of said dielectric layer.

12. A method comprising steps of:
    growing a base region in a transistor region;
    depositing a dielectric layer over said transistor region and on top of said base region;
    fabricating an opening in said dielectric layer over said base region;
    forming an emitter layer on top of said dielectric layer;
    utilizing a polymerizing etch chemistry to etch said emitter layer down to a first depth, whereby an emitter region is created in said opening;
    using a non-polymerizing isotropic etch chemistry to create a notch in said dielectric layer below said emitter region so as to reduce an overlap area of a capacitance formed between said emitter region and said base region.

13. The method of claim 12 wherein said base region comprises silicon-germanium.

14. The method of claim 12 wherein said emitter layer comprises polycrystalline silicon.

15. The method of claim 12 wherein said dielectric layer is selected from a group consisting of silicon dioxide, silicon nitride, and a low-k dielectric.

16. The method of claim 12 wherein said polymerizing etch chemistry forms a passivation layer on a surface of said emitter region.

17. The method of claim 12 further comprising a step of manufacturing a conductive layer on top of said dielectric layer prior to said step of fabricating an opening in said dielectric layer.

18. The method of claim 17 wherein said notch is created in said dielectric layer and said conductive layer.

19. The method of claim 17 wherein said conductive layer comprises polycrystalline silicon.

20. The method of claim 12 wherein said capacitance is inversely proportional to a size of said notch.

21. The method of claim 12 wherein said capacitance is directly proportional to a size of said overlap area.

22. The method of claim 12 wherein said capacitor is inversely proportional to a thickness of said dielectric layer.

* * * * *